(12) United States Patent
Serre et al.

(10) Patent No.: US 10,039,194 B2
(45) Date of Patent: Jul. 31, 2018

(54) DUAL SOLDER LAYER FOR FLUIDIC SELF ASSEMBLY AND ELECTRICAL COMPONENT SUBSTRATE AND METHOD EMPLOYING SAME

(71) Applicant: OSRAM SYLVANIA Inc., Danvers, MA (US)

(72) Inventors: Jeffery Serre, Peabody, MA (US); Alan Lenef, Belmont, MA (US); Adam Scotch, Amesbury, MA (US)

(73) Assignee: OSRAM SYLVANIA Inc., Wilmington, MA (US)

( * ) Notice: Subject to any disclaimer, the term of this patent is extended or adjusted under 35 U.S.C. 154(b) by 0 days.

(21) Appl. No.: 14/415,676

(22) PCT Filed: Aug. 1, 2013

(86) PCT No.: PCT/US2013/053135
§ 371 (c)(1),
(2) Date: Jan. 19, 2015

(87) PCT Pub. No.: WO2014/022619
PCT Pub. Date: Feb. 6, 2014

(65) Prior Publication Data
US 2015/0223346 A1 Aug. 6, 2015

Related U.S. Application Data

(60) Provisional application No. 61/678,933, filed on Aug. 2, 2012.

(51) Int. Cl.
*H05K 3/34* (2006.01)
*B23K 3/06* (2006.01)
(Continued)

(52) U.S. Cl.
CPC ......... *H05K 3/3431* (2013.01); *B23K 1/0016* (2013.01); *B23K 1/20* (2013.01);
(Continued)

(58) Field of Classification Search
CPC .... H05K 3/3431; H05K 1/111; H05K 3/3468; H05K 13/0465; H05K 3/34; H05K 13/04;
(Continued)

(56) References Cited

U.S. PATENT DOCUMENTS 4,398,975 A * 8/1983 Ohsawa ................ C22C 28/00
148/400
5,071,787 A * 12/1991 Mori .................... B23K 35/001
228/180.22
(Continued)

FOREIGN PATENT DOCUMENTS

EP 2 052 805 A1 4/2009
EP 2 688 093 A1 1/2014
(Continued)

OTHER PUBLICATIONS

Abstract JP 2006 278463.
(Continued)

*Primary Examiner* — Michael F McAllister
(74) *Attorney, Agent, or Firm* — Robert F. Clark; Shaun P. Montana (57) ABSTRACT

A dual solder layer for fluidic self assembly, an electrical component substrate, and method employing same is described. The dual solder layer comprises a layer of a self-assembly solder disposed on a layer of a base solder which is disposed on the solder pad of an electrical component substrate. The self-assembly solder has a liquidus temperature less than a first temperature and the base solder has a solidus temperature greater than the first temperature. The self-assembly solder liquefies at the first temperature
(Continued)

during a fluidic self assembly method to cause electrical components to adhere to the substrate. After attachment, the substrate is removed from the bath and heated so that the base solder and self-assembly solder combine to form a composite alloy which forms the final electrical solder connection between the component and the solder pad on the substrate.

14 Claims, 7 Drawing Sheets

(51) Int. Cl.
  *B23K 1/00*      (2006.01)
  *B23K 1/20*      (2006.01)
  *H05K 1/11*      (2006.01)
  *H05K 13/04*     (2006.01)
  *H01L 23/00*     (2006.01)
  *H01L 33/62*     (2010.01)

(52) U.S. Cl.
  CPC ............ *B23K 3/0684* (2013.01); *H01L 24/29* (2013.01); *H01L 24/32* (2013.01); *H01L 24/83* (2013.01); *H01L 24/95* (2013.01); *H01L 24/97* (2013.01); *H05K 1/111* (2013.01); *H05K 3/3468* (2013.01); *H05K 13/0465* (2013.01); *H01L 33/62* (2013.01); *H01L 2224/29082* (2013.01); *H01L 2224/29105* (2013.01); *H01L 2224/29113* (2013.01); *H01L 2224/325* (2013.01); *H01L 2224/8321* (2013.01); *H01L 2224/83143* (2013.01); *H01L 2224/83192* (2013.01); *H01L 2224/83815* (2013.01); *H01L 2224/83907* (2013.01); *H01L 2224/95085* (2013.01); *H01L 2224/95101* (2013.01); *H01L 2224/95146* (2013.01); *H01L 2224/97* (2013.01); *H01L 2924/01322* (2013.01); *H05K 2201/10992* (2013.01); *H05K 2203/044* (2013.01); *H05K 2203/047* (2013.01); *H05K 2203/048* (2013.01)

(58) Field of Classification Search
  CPC ...... B23K 1/0016; B23K 1/20; B23K 3/0684; B23K 3/06; B23K 1/00
  USPC .......................... 228/187, 226, 233.2, 180.22
  See application file for complete search history.

(56) References Cited

U.S. PATENT DOCUMENTS

| | | | |
|---|---|---|---|
| 5,672,913 A * | 9/1997 | Baldwin | H01L 21/563 257/737 |
| 5,803,343 A * | 9/1998 | Sarma | H01L 21/4846 228/180.21 |
| 5,803,344 A * | 9/1998 | Stankavich | H05K 3/3484 228/180.22 |
| 6,153,940 A * | 11/2000 | Zakel | H01L 24/81 228/180.22 |
| 6,740,544 B2 * | 5/2004 | Strouse | H01L 24/29 257/772 |
| 7,625,780 B2 | 12/2009 | Jacobs et al. | |
| 7,774,929 B2 | 8/2010 | Jacobs | |
| 8,318,595 B2 * | 11/2012 | Morris | H01L 24/95 257/E23.021 |
| 2003/0215981 A1 * | 11/2003 | Strouse | H01L 24/29 438/118 |
| 2008/0023435 A1 | 1/2008 | Wu et al. | |
| 2009/0137082 A1 * | 5/2009 | Kurita | B23K 1/0016 438/106 |
| 2010/0139954 A1 | 6/2010 | Morris et al. | |
| 2012/0055586 A1 * | 3/2012 | McIsaac | B23K 1/0008 148/24 |

FOREIGN PATENT DOCUMENTS

| | | |
|---|---|---|
| JP | H0529363 A | 2/1993 |
| JP | H06 61277 | 3/1994 |
| JP | 2006 278463 | 10/2006 |
| KR | 20120045965 A | 5/2012 |
| WO | WO 01/34765 | 5/2001 |
| WO | WO 2010/034824 | 4/2010 |
| WO | WO 2014/022619 A2 | 2/2014 |
| WO | WO 2014/022619 A8 | 2/2014 |

OTHER PUBLICATIONS

Abstract JP H06 61277.
Lee, High Melting Lead-Free Mixed BiAgX Solder Paste System, Indium Corporation Tech Paper (2012).
Knuesel et al., Self-assembly of microscopic chiplets at a liquid-liquid-solid interface forming a flexible segmented monocrystalline solar cell, Proc. National Academy of Sciences, 107 (2010) 993-998.
Song et al., Microstructures, Thermal and Tensile Properties of Sn-Zn-Ga Alloys, Materials Transactions, 45 (2004) 776-782.
Miric et al., Lead-free Alloys, Surface and Surface Mount Technology, 10 (1998) 19-25.
Yamamoto et al., Assembly Technology Using Lead-Free Solder, Fujitsu Sci. Tech. J. 43 (2007) 50-58.
Kattner, Phase Diagrams for Lead-Free Solder Alloys, JOM (2002) 45-51.
Yamaguchi et al., Properties of Solder Joints Using Sn-Ag-Bi-In Solder, Materials Transactions, 45 (2004) 1282-1289.
PCT Search Report, PCT/US2013/053135.

* cited by examiner

DUAL SOLDER LAYER FOR FLUIDIC SELF ASSEMBLY AND ELECTRICAL COMPONENT SUBSTRATE AND METHOD EMPLOYING SAME

CROSS-REFERENCE TO RELATED APPLICATIONS

This application is a U.S. National Stage application of, and claims the benefit of, International Application No. PCT/US2013/053135, filed Aug. 1, 2013, which claims the benefit of U.S. Provisional Patent Application Ser. No. 61/678,933, filed Aug. 2, 2012 and entitled "DUAL SOLDER LAYER FOR FLUIDIC SELF ASSEMBLY AND ELECTRICAL COMPONENT SUBSTRATE AND METHOD EMPLOYING SAME", the entire contents of which are hereby incorporated by reference.

BACKGROUND OF THE INVENTION

The placement of electronic components using self assembly is becoming an important approach for high-volume production of electronic assemblies. For example, it is well-known to use fluidic self assembly (SA) in the production of radio-frequency identification tags (RFIDs). In that approach, sub-millimeter integrated packages with distinct dimensions and trapezoidal shapes are dropped into an agitated fluid where they fit into specific matching depressions on a substrate. Packages that don't fall into depressions are removed and redropped until all are matched. Circuit connections are then made by masking and depositing conducting strips over the electronic packages. This approach works well at high volumes, but requires very specific geometrically-shaped components or packages and substrates which have to be specially etched to accommodate the packages.

A more general approach that has been investigated does not require specially-shaped packages and can use more standard components. In this approach, components are dropped into an agitated fluid where they find proper locations on a substrate through contact and adherence using various approaches. For example, hydrophilic and hydrophobic materials may be coated on the components and desired substrate locations, or bonding sites, such that when parts find proper locations they tend to stick when the same coatings come into contact, i.e., hydrophilic-hydrophilic or hydrophobic-hydrophobic; mixed coatings do not stick. Agitating the fluid is also necessary since it randomized the motion of the components, allowing them to make contact attempts with all regions of the substrate. Furthermore, if they don't stick on the first attempt, agitation allows the components to make many attempts until they finally find a bonding site.

One of the best ways to achieve the self assembly is by using the strong wetting effects of solder on a metal contact to "pull" components into place. Unlike other SA bonding materials, solder also has a high lubrication; this implies that once the component makes contact with the solder, the component can find the minimum energy configuration with minimal friction. This wetting effect occurs when the solder is a liquid, therefore self assembly of components must be done above the melting point of the solder. In the case of solder SA, one immerses the substrate and the electronic components in a liquid, allowing the liquid to carry components into their positions. The solder wetting effect takes over when the components come into contact with the melted solder on the substrate, pulling the components into their final position and retaining them. Note that in particular, using solder fluxes as the binding agent is not useful for SA because of their low degree of lubrication.

For solder SA, low melting temperature solder ($T_m$<150° C., where $T_m$ is the melting point) is used for a variety of reasons. One reason is that simple lower viscosity non-toxic fluids such as water are easy to use, but obviously require temperatures to be below their boiling point. Furthermore, since electronic or opto-electronic components are immersed in the hot liquid on the order of one minute in typical SA runs, high temperatures may damage the components. Unfortunately, very low temperature solders ($T_m$<100° C.), generally require Bi which generally leads to poor bonding and therefore unreliable long term attachment of components. Solder compositions such as Sn—In can have $T_m$=145° C., but again reliable bonding is not acceptable for long term attachment of components. In addition, use of solders with such low melting points may be problematic for long term operation of components such as light emitting diodes (LEDs) whose operating temperatures may approach or even exceed the melting point of such low temperature solders.

U.S. Patent Publication No. 2010/0139954 to Morris et al. discloses an approach by which solder or fluid based-SA can be performed at practical temperatures while still providing a method to permanently electrical bond components with reliable higher temperature solders. The approach uses multiple sites that perform different functions. In particular, a central site on the component is used for a SA binding site while spatially separated sites closer to the part boundaries are used for electrical bonding. Generally the electrical bonding sites are solder bumps. All contacts are on the bottom of the component and are designed to mate with matching sites on the substrate. The central binding site on the substrate supports a low temperature solder (or other material) that forms a hemispherical shape when liquefied. The height of the central SA solder when liquid exceeds the height of the solid electrical solder bumps. The solder bumps melt at a higher temperature than the central binding site solder. In the embodiment described, eutectic Bi—Sn solder ($T_m$=138° C.) is employed for SA binding sites which bind to solder bumps on electrical components. The solder bumps are composed of eutectic Sn—Pb ($T_m$=183° C.) which are well known to form reliable, high conductivity electrical connections. Assembly is performed in two steps. In the first step, components and substrate are placed in a fluidic bath at a temperature above the melting point of the solder or material on the central SA biding site, but below that of the solder bumps. Self-assembly onto the central pads is performed in the liquid bath. When components contact the central SA solder that is on the substrate, the bulging profile relaxes because of the additional wetting of the component contact. The assembled substrate is cooled to fix the component locations. The substrate is then placed into a reflow oven where temperatures are above the melting point of the solder bumps which must then expand to reach the contacts on the components. While this approach permits electrical connections with more reliable and higher conductivity, components and substrates require additional contacts and pads which lead to greater fabrication complexity. More significantly, practical applications of this method require components with solder bumps and additional solder masks for coating only the SA binding sites with low temperature solder. This leads to longer overall manufacturing times and cost, both of which SA should alleviate. Other problems occur with this method because the physical height changes of the SA solders and electrical bonding solders must be compatible with the process.

SUMMARY OF THE INVENTION

It is an object of the invention to obviate the disadvantages of the prior art.

The present invention solves the above problems by combining the advantages of low temperature solder for self assembly (SA) with a higher temperature, reflowable solder to make a final, more reliable joint.

This invention employs a two-layer method by which fluidic solder-based self assembly can take place with at low temperatures while final soldering can be done using higher temperature solders which are known to be more reliable. Furthermore, unlike the separated electrical contact/binding site approach described above, self assembly and electrical connections can be made with the same contact pad. This permits much more flexibility in component contact and substrate pad configurations. Additionally, because low and high temperature solders are both applied to the same bond pad, the assembly process is straightforward, decreasing assembly time and reducing cost.

Two layers of solder are used for each electrical contact. No other contacts are required. Thus contacts serve both as SA binding sites and solder connection sites. The base layer solder is suitable for high reliability and high electrical conductivity. Typically this would be solder used for reflow. The second top layer is low melting temperature solder or liquid metal that is used for SA. In one embodiment, this top low temperature SA solder layer would be thinner than the base layer, the proportions being dependent on the compositions of the solders involved. However, this is not a definitive constraint in the invention. This scheme would allow for the low temperature SA solder layer to melt and bond components to the substrate during the self assembly step after cooling. Since parts are already bonded at the proper locations, the cooled substrate would be reheated to temperatures above the melting point of the base solder layer either in a reflow oven or other means in which both layers of solder would melt. With the proper selection of solders, the two solder layers would mix and form a more reliable and higher conductivity joint than would be possible with the low temperature SA solder alone.

In accordance with an aspect of the invention, there is provided an electrical component substrate comprising at least one solder pad having a dual solder layer, the dual solder layer comprising a first layer of a self-assembly solder and a second layer of a base solder, the second layer of the base solder being disposed on the solder pad and the first layer of the self-assembly solder being disposed on the second layer, wherein the self-assembly solder has a liquidus temperature less than a first temperature and the base solder has a solidus temperature greater than the first temperature.

In accordance with another aspect of the invention, there is provided method for fluidic self assembly, comprising:

(a) obtaining an electrical component substrate, the substrate comprising at least one solder pad having a dual solder layer, the dual solder layer comprising a first layer of a self-assembly solder and a second layer of a base solder, the second layer of the base solder being disposed on the solder pad and the first layer of the self-assembly solder being disposed on the second layer, wherein the self-assembly solder has a liquidus temperature less than a first temperature and the base solder has a solidus temperature greater than the first temperature;

(b) immersing the electrical component substrate and at least one electrical component in a fluid bath at the first temperature so that the self-assembly solder liquefies;

(c) agitating the fluid bath so that the electrical component adheres to the liquefied self-assembly solder;

(d) removing the electrical component substrate from the fluid bath;

(e) heating the electrical component substrate to a second temperature that is greater than the solidus temperature of the base solder so that the base solder and self-assembly solder combine to form a composite alloy; and (f) cooling the composite alloy to form an electrical solder connection between the electrical component and the solder pad on the electrical component substrate.

In one embodiment, the first temperature is less than about 150° C., and more preferably less than about 100° C.

In another embodiment, the mass ratio of the self-assembly solder to the base solder is less than 1, and more preferably between 0.5 and 1.

BRIEF DESCRIPTION OF THE DRAWINGS

FIG. 5 is a binary phase diagram for Ga—In.

DETAILED DESCRIPTION OF THE INVENTION

For a better understanding of the present invention, together with other and further objects, advantages and capabilities thereof, reference is made to the following disclosure and appended claims taken in conjunction with the above-described drawings.

Figure 1A:
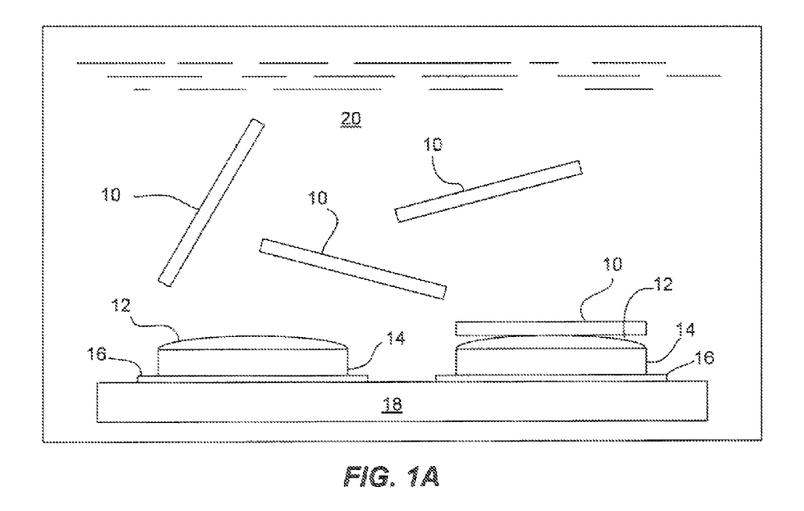
FIGS. 1A-1C schematically illustrate an embodiment of a two-layer, solder-based self-assembly substrate and method according to this invention.
Figure 1B:
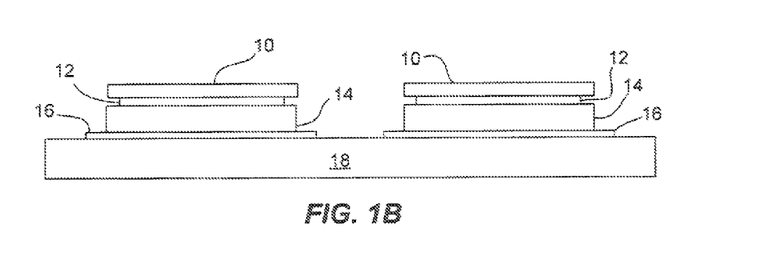
Figure 1C:
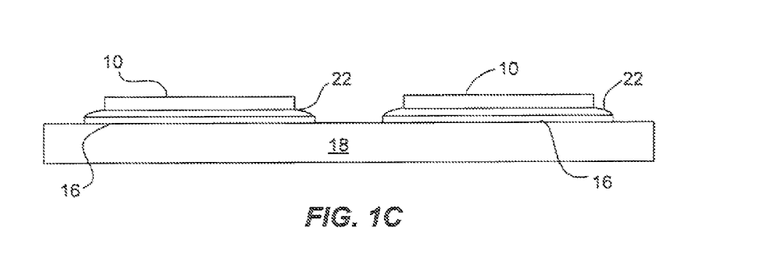

An embodiment of the self-assembly method employing an embodiment of an electrical component substrate in accordance with this invention is illustrated in FIGS. 1A-1C. For the sake of example, we consider SA of identical one-contact components. The two-layer solder has already been applied to the solder pads 16 of electrical component substrate 18. In FIG. 1A components 10 are placed in a liquid bath 20 whose temperature is above the melting point of the upper SA solder layer 12 but below the melting point of the base solder layer 14. The upper SA solder layer 12 is therefore liquid at the temperature of the bath whereas the base solder layer 14 which is attached to solder pad 16 on substrate 18 remains solid. Generally, the bath 20 consists of fluids such as water or ethylene glycol that do not react or damage components, solders, or substrate materials. The fluid is normally agitated to increase the probability of component attachment to solder sites on the substrate. The components 10 have their electrical contacts coated with gold or other noble metals to which the liquefied upper SA solder layer 12 will effectively wet. Preferably, the components 10 are LED dies.

After some time all or most of the parts will have attached to desired solder binding sites and the SA process is terminated. The time necessary to achieve the desired attachment yield is determined by the agitation rate, the physical parameters of the liquid bath, temperature, solder surface energies, component contact characteristics, and other factors. The substrate is then cooled to allow the SA solder to solidify. In some embodiments, the SA solder is not required to solidify, provided the binding strength of the liquid SA solder is high enough to prevent components from detaching when removing the substrate from the bath. The resulting configuration for the case of solidified SA solder is shown in FIG. 1B.

In a final step, the base solder layer 14 is melted so that components 10 form electrical solder connections 22 to the solder pads 16. This can be accomplished by a variety of methods known in the art, but typically would consist of passing the substrate through a reflow oven with desired time-temperature profiles. During this final reflow period both base and SA solder layers melt to form a liquid whose composition now consists of the mixture of both solders. During cooling, the solder melt will solidify forming electrical solder connections 22 comprised of a new composite alloy with the desired electrical and mechanical characteristics. This is depicted in FIG. 1C.

Since the two solders form a composite alloy, the compositions and molar fractions of both base and SA solders should be chosen appropriately. Possible materials for the low melting point required for the SA solder preferably include systems with low toxicity (Hg, Pb, Sb, and Cd-free), high surface energy for reliable SA, and dissolution into common Pb-free reflow solders that would be used for the base solder. Dissolution of the SA solder into the base solder is normally possible if the molar fraction of the SA solder is not too large; less than 10% is typical. Alternatively, one could choose the molar concentrations of the SA and base solders such that they are on a eutectic; however, this requires careful monitoring of SA and base solder mass ratios on each solder pad. Therefore, the eutectic method is less desirable. In a third method, the SA solder molar fraction may have values greater than 10%, perhaps 50% or more. The solidified composite forms a new alloy, albeit different than the original alloy of the base solder. This is the preferred method, because the application of the SA solder is least constrained and can be applied by simple "tinning" methods in which the substrate just contacts a liquid SA solder bath.

In many cases, it may be desirable to have the SA bath be at temperatures even close to room temperature. This would generally limit the SA solder to either pure elemental or metal alloys consisting primarily of Ga, In, Bi, and Sn, since many alloys of these constituents are known with melting points below even 100° C. Use of pure Ga or Ga-alloys in particular may be particularly advantageous because of gallium's low toxicity and very low melting point of 29.8° C. Ga is also soluble in other alloys. Preferably, the base solder is a solder with a melting point well above the expected operating temperature to minimize long term failure such as creep or oxidation but well below any component or substrate damage threshold.

In a first embodiment, the SA solder is chosen to have a lower melting point than the base solder. No requirements are made regarding compositions such as being eutectic, binary, or other physical factors or properties. In particular, the self-assembly process occurs at a temperature $T_1 > T_{SA,L}$, where $T_{SA,L}$ is the liquidus temperature of the SA solder. Additionally, the base solder is chosen so it's solidus temperature $T_{B,S} > T_1$. Furthermore, during the reflow or final attachment process, the temperature for forming the final electrical solder connections, $T_2$, is higher than the liquidus for the base solder, or $T_2 > T_{B,L}$ and will always exceed the liquidus temperature of the initial SA solder alloy. The final criterion is that the temperature $T_2$ also be high enough to keep the entire SA and base solder solution in the liquid state; that is $T_2 > T_{comp,L}$, where $T_{comp,L}$ is the liquidus temperature of the final composite alloy that forms from the liquid solution of the SA and base solders.

Figure 2A:
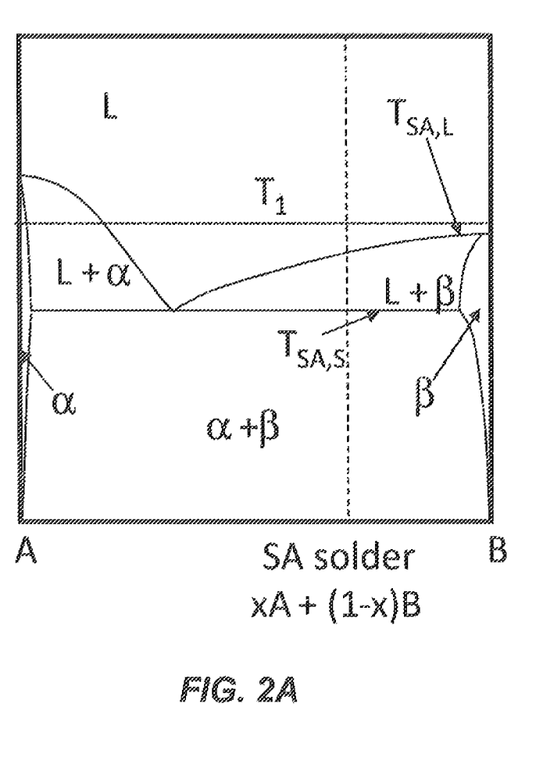
FIGS. 2A and 2B are exemplary binary phase diagrams for self-assembly (SA) solders and base solders, respectively.
Figure 2B:
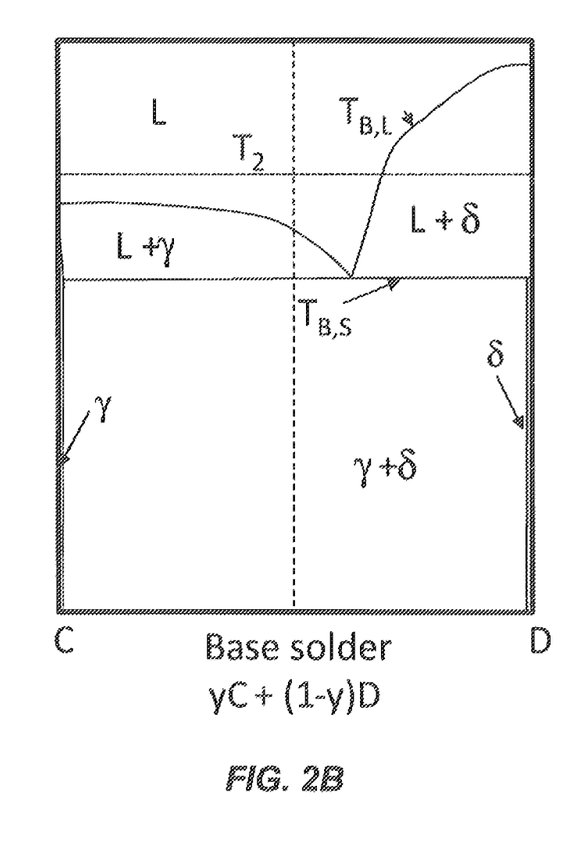

For the sake of illustration, FIGS. 2A and 2B show two hypothetical phase diagrams for binary SA and base solder alloys, respectively, together with the above defined temperatures. The SA solder is assumed to be a binary alloy consisting of components A and B with compositions ranging from 0% to 100% of B, inclusive. Similarly, the base solder is assumed to consist of components C and D with compositions ranging from 0% to 100% of D, inclusive. In the example, the SA and base solders are assumed to have compositions $xA+(1-x)B$ and $yC+(1-y)D$, respectively, where x and y are the respective molar fractions of A and C. In the case of the SA solder, the solid form consists of mixtures of A-rich $\alpha$ phase or solution and B-rich $\beta$ phase. Note that choosing eutectic compositions for the SA and base solders are not necessarily advantageous because the final composition of the composite SA and base alloys determine the final reliability properties of the soldered components.

In general, SA solder systems for this embodiment may consist of a pure metal, binary, ternary, or higher order alloys which use at least one of the following low melting point elements: Ga, In, Bi, Se, Sn, and Zn. Antimony is also a possibility in some applications, but its toxicity is greater than Ga, In, Bi, Sn, and Zn. Alkali metals generally have very low melting points, but their reactivity is highly undesirable for solder. The SA solder alloys may also include small impurities (<1%) of the elements including, but not limited to Ag, Au, Al, Cu, Ge, Ni, or Si. Such impurities are normally not desirable for the SA solder because they will increase the melting point of the SA solder, but may be either necessary to enhance final composite solder properties or dissolution behavior as the two-layer system is heated to the higher reflow temperature. Furthermore, such impurities may be unavoidable for practical solder systems.

For the next embodiments of the invention, we consider SA solder compositions that have as low a melting point as possible, but will not incur undesirable properties in the final composite solder joint. The base solder is preferably a compatible lead-free solder. To reduce the number of elemental choices for the SA solder, we consider the lowest melting point elements that are usable in low toxicity solders: Ga, In, Bi, and Sn (Table 1). Note that indium generally induces creep in solder joints and should probably be avoided in most applications. It also is expensive. However, certain indium compositions have been shown to have good solder properties which are therefore useful in two layer solder self-assembly.

TABLE 1

PRIMARY ELEMENTS FOR SELF-ASSEMBLY SOLDERS

| Element | Melting point ($T_m$ in ° C.) |
|---|---|
| Ga | 29.8 |
| In | 156.7 |
| Sn | 232 |
| Bi | 271 |

One important characteristic for two-layer solder self-assembly is the mass ratio $R_M$ of SA solder, $M_{SA}$, to base solder, $M_B$, where $R_M=M_{SA}/M_B$. Generally this ratio will be much less than one because the SA solder normally contains substantial amounts of a low melting element to keep the SA solder melting point at reasonable values. On the other hand, these elements generally have smaller mass fractions in the final composite solder in order to have reasonable solder properties and higher melting points needed to minimize creep and other issues when components operate above ambient temperatures. Self-assembly however is better suited if the mass ratio $R_M$ is closer to one-half or more. This is because enough molten material must be presented to the components in the liquid bath to form adequate binding sites. Furthermore, application of the SA solder would generally be done in molten form and will strongly wet the underlying solid base solder; therefore controlled application of small amounts of SA solder is more difficult. Additionally, one would want to keep the total mass of base and SA solders to amounts similar to conventional one-layer reflow or other solder processes. Therefore, placing large amounts of base solder on the substrate to accommodate deposition of larger amounts of SA solder is not practical. With these concepts in mind, we consider examples practical systems for two-layer solder self-assembly in the next embodiments.

For a second embodiment, we consider Bi binary alloys. Bi—Sn is one of the best choices as it has a eutectic temperature of 139° C. at 57 weight % Bi. While Bi solders have some reliability tradeoffs, including brittleness and moderate toxicity, they may have applications in certain two-layer self-assembly processes. Thus one may use Bi(58)-Sn(42) eutectic solder for the SA solder of mass $M_{SA}$. Note all fractional solder alloy compositions are in weight percent (wt. %). For example, Bi(58)-Sn(42) contains 58 wt. % Bi and 42 wt. % Sn. For a compatible base solder one may use compatible alloys of Sn—Ag or Sn—Ag—Cu. If one uses for example a commercially available alloy (Indium Corp.) Sn(96.5)-Ag(3.0)-Cu(0.5) ($T_L$=220° C.), the composite solder after reflow will be close to a well known system Sn(90)-Ag(2.0)-Bi(7.5)-Cu(0.5) which has a melting point in the range of 198-212° C. This is suitable for reflow bonding and is within an acceptable temperature range for components such as LEDs.

The required mass fraction, $R_M$, of SA solder to base solder can be found by the formula:

$$R_M = \frac{x_{Bi-SA}}{x_{Bi-Comp}} - 1, \quad (1)$$

where $x_{Bi-SA}$ is the mass concentration of Bi in the SA solder and $x_{Bi-Comp}$ is the mass concentration in the composite solder after reflow. For the case of 7.5% Bi in the composite solder, the mass fraction of SA solder to base solder is approximately 0.15. The final composite solder composition is Sn(89.4%)-Ag(2.6)-Bi(7.5)-Cu(0.4) which is not too far from the desired composition.

In general, one would make trade-offs between higher mass fractions of SA solder which may be beneficial for deposition of SA solder and self-assembly requirements, while lower mass fractions reduce Bi content and may give better composite solder properties. For example, a solder Sn(91.8)-Ag(3.4)-Bi(4.8) has shown excellent long-term electrical and thermal properties with a melting point in the range of 200-216° C. In this case one could start with a base solder of Sn(96.5)-Ag(3.5) eutectic alloy (available from Indium Corp.) which has a melting point of 221° C., which is somewhat high but acceptable for reflow. With a desired mass fraction $R_M$=0.090, the resulting composite solder is very close to the desired Sn(92.0)-Ag(3.2)-Bi(4.8).

In general, one can use a eutectic Sn—Bi alloy for the SA solder, together with a variety of available Sn—Ag alloys for the base solder, with Sn mass concentrations of at least 80% and preferably greater than 90% to achieve usable reflow temperatures. Additionally, variations on the eutectic Sn—Bi alloy such as ternary alloys Sn(42)-Bi(57)-Ag(1.0) have melting temperatures ($T_1$=140° C.) very close the binary eutectic, but may have additional desired properties. Such ternary alloys have been used in commercial products.

In a third embodiment, we consider alloys with In, which may give good solder properties for the final composite solder alloy. Quaternary alloys of the form Sn—Ag—Bi—In, have been investigated wherein the In mass concentration varied from 2.5-8.0%. In particular, the higher In composition Sn(88)-Ag(3.5)-Bi(0.5)-In(8) was found to have good strength and joint reliability in long-term testing, while having a reasonable solidus melting point $T_S$=165° C. and a liquidus point of $T_L$=206° C. Because In has a low melting point (Table 1), it is very useful for SA solder and can permit a more balanced mass ratio of SA solder to base solder than Bi-based SA solders.

A good choice for an In-based SA solder is the eutectic In(50.9)-Sn(49.1) alloy which has a melting point $T_m$=120° C., somewhat lower than the Bi—Sn eutectic. From Equation (1) for the case of In, we find that the mass fraction $R_M$=0.195 and the desired base solder composition is Sn(96.2)-Ag(4.2)-Bi(0.6). The liquidus point for this ternary alloy is about 235° C. which is slightly higher than desirable due to the formation of a Ag$_3$Sn phase. Reducing the Ag concentration in the base solder to 3.5% gives a better liquidus point of about 220° C. Using the reduced Ag concentration and altering the balance of Sn in the base solder gives a final composite solder Sn(88.6)-Ag(2.9)-Bi(0.5)-In(8) which should have properties close to the solder described above. Note that more generally, a variety of In—Bi—Sn and In—Bi alloys have even lower melting points the In—Sn eutectic and may be useful for SA solders with the proper base solder composition.

Figure 3:
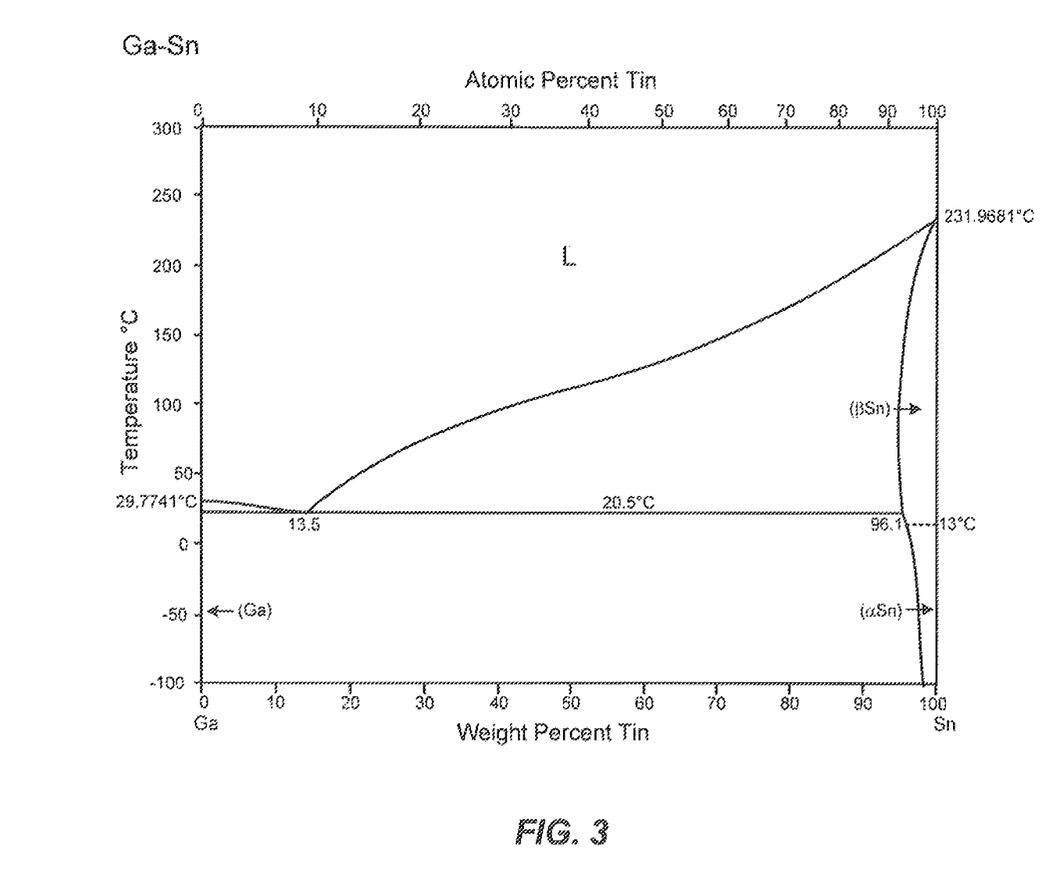
FIG. 3 is a binary phase diagram for Ga—Sn.
Figure 4:
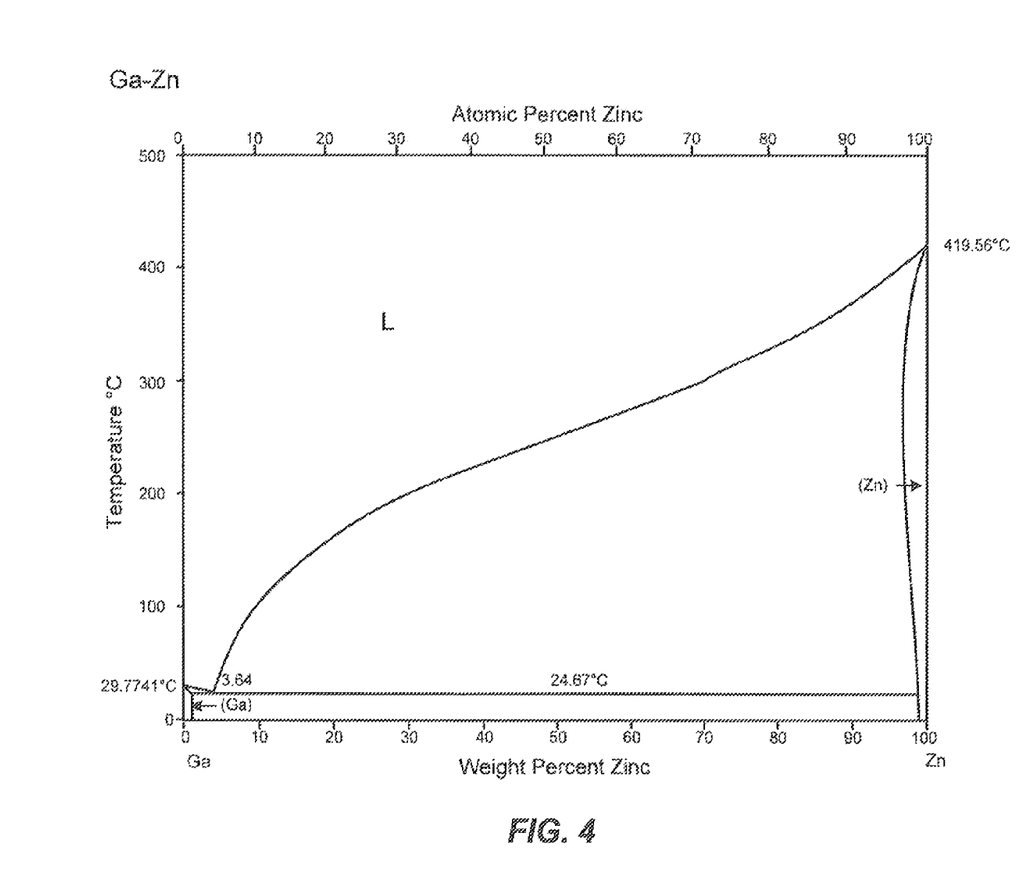
FIG. 4 is a binary phase diagram for Ga—Zn.
Figure 5:
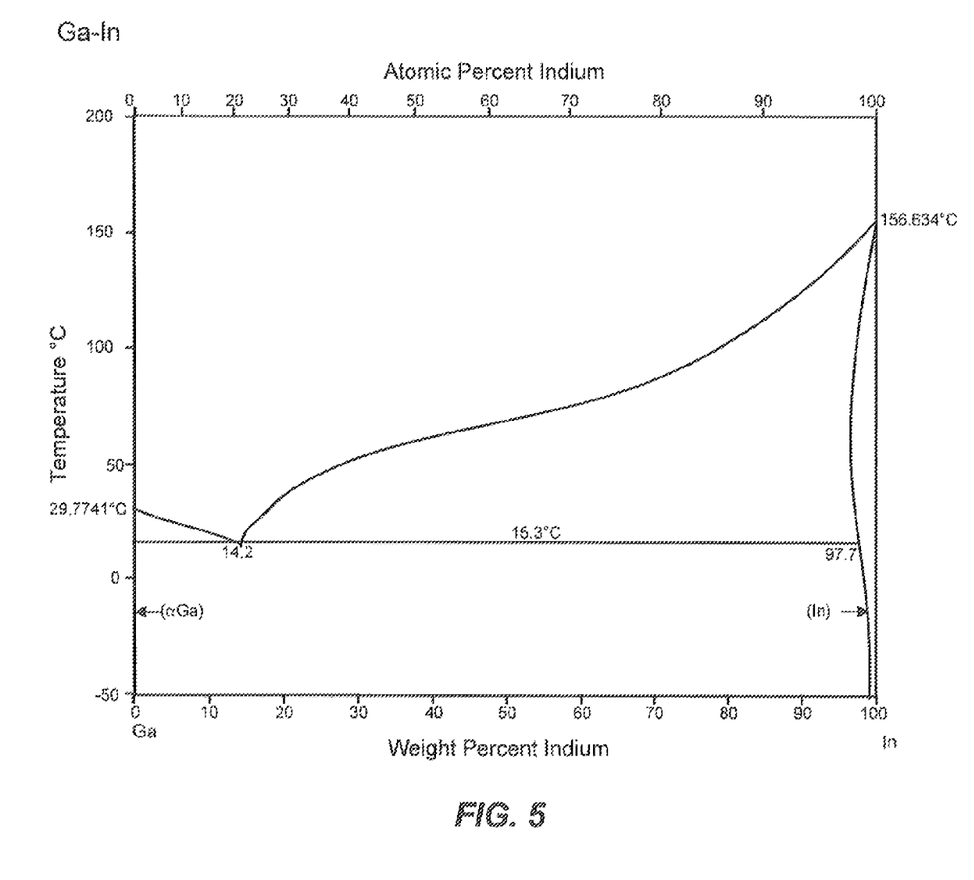

In a fourth embodiment, we consider Ga alloys for the SA solder because of gallium's very low melting point (Table 1) and desirable metallurgical properties when used as an additive with other solder alloys. The very low Ga melting point implies a wide range of Ga alloys will also have low melting points over a large composition range, permitting self-assembly at temperatures closer to room temperature. As discussed this is strongly desirable for two-layer solder self-assembly. Binary alloys of Ga include Ga—Sn, Ga—Zn, and Ga—In. Phase diagrams for these alloys are shown in FIGS. 3-5, respectively.

Figure 6:
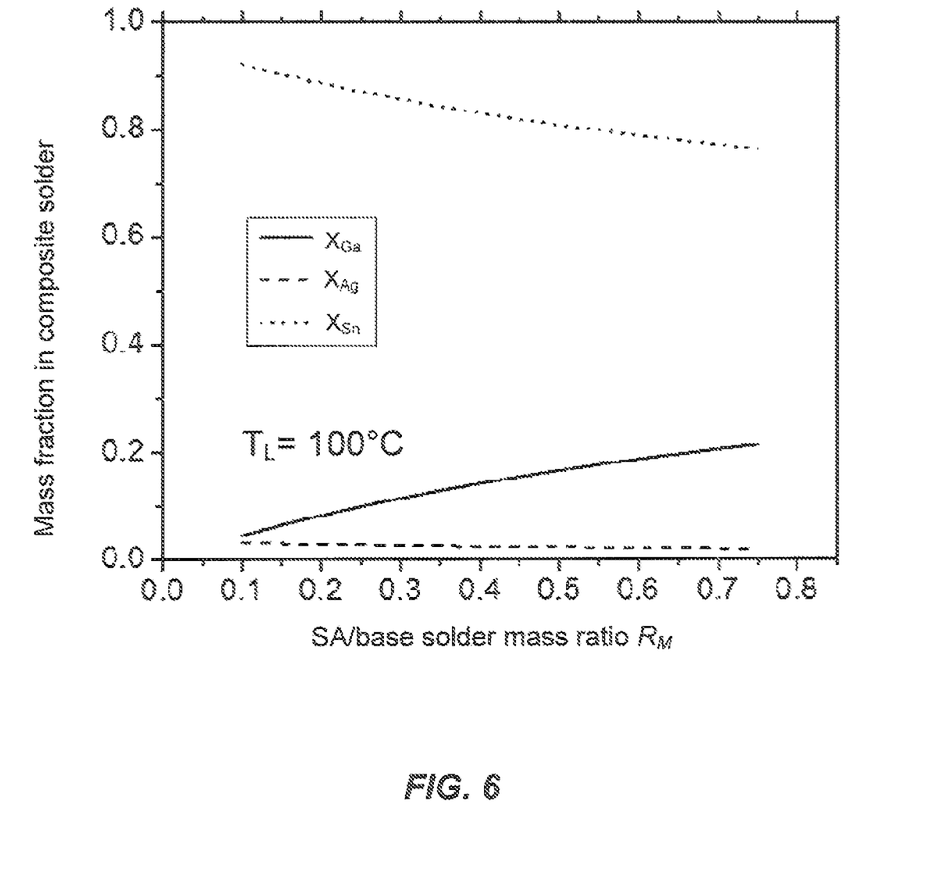
FIG. 6 is a graphical representation of the calculated mass fraction of elements in a composite solder after reflow for Sn(0.5)-Ga(0.5).
Figure 7:
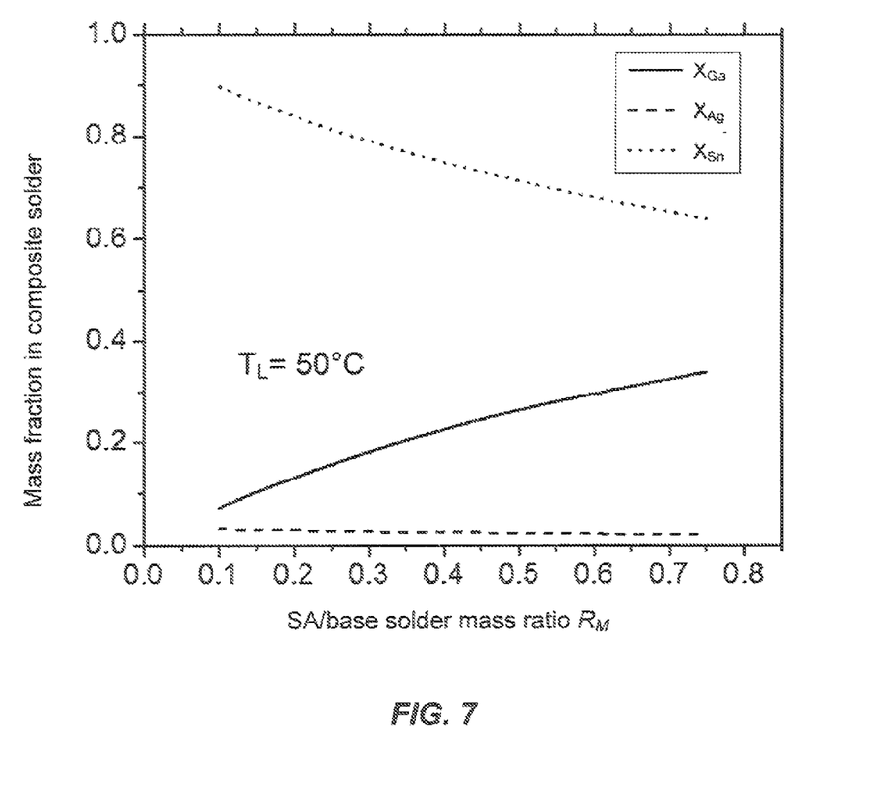
FIG. 7 is a graphical representation of the calculated mass fraction of elements in a composite solder after reflow for Sn(0.21)-Ga(0.79).

For the sake of example with Ga, we consider the simplest SA solder and base solder compositions. Referring to FIG. 3, we consider a base solder composition of Sn(1−y)-Ga(y), where y is the mass fraction of Ga. If the maximum usable SA solder liquidus were assumed to be below 150° C., then the fraction of Ga, y>0.25. For more reasonable temperatures of $T_L$=100° C. or 50° C., y=0.5 and 0.79 respectively. A reasonable base solder is the eutectic solder Sn(96.5)-Ag(3.5) with a melting point of $T_m$=221° C., well above the liquidus temperatures for the range of Sn(1−y)-Ga(y) alloys considered. FIG. 6 shows calculated mass fractions of the composite alloy as a function of $R_M$, the SA solder to base solder mass ratio assuming an SA solder composition of Sn(0.50)-Ga(0.50). A similar calculation in shown in FIG. 7 for the lower temperature SA solder composition of Sn(0.21)-Ga(0.79).

In principle, a wide range of binary, ternary, and even quaternary Ga-based SA solder alloys may exist, including Ga with major components of Sn, Zn, In, and Bi. For the base solder, lead-free alloys may be based on binary systems that include Sn such as Sn—Ag, Sn—Au, Sn—Zn, Sn—Cu, Sn—Bi, and Sn—In. Suitable alloys may further include lesser amounts of Cu, Al, Ni, and Mg to aid solder properties. However, SA solder and base solder compositions are not limited to these combinations.

While there have been shown and described what are at present considered to be the preferred embodiments of the invention, it will be apparent to those skilled in the art that various changes and modifications can be made herein without departing from the scope of the invention as defined by the appended claims.

What is claimed is:

1. An electrical component substrate, comprising at least one solder pad having a dual solder layer, the dual solder layer comprising a first layer of a self-assembly solder and a second layer of a base solder, the second layer of the base solder being disposed on the solder pad and the first layer of the self-assembly solder being disposed on the second layer, wherein the self-assembly solder has a liquidus temperature less than a first temperature and the base solder has a solidus temperature greater than the first temperature.

2. The electrical component substrate of claim 1, wherein the first temperature is less than about 150° C.

3. The electrical component substrate of claim 1, wherein the first temperature is less than about 100° C.

4. The electrical component substrate of claim 1, wherein a thickness of the first layer is less than a thickness of the second layer.

5. The electrical component substrate of claim 1 wherein a molar fraction of the self-assembly solder in the dual solder layer is less than about 10%.

6. The electrical component substrate of claim 1 wherein a mass ratio of the self-assembly solder to the base solder is less than 1.

7. The electrical component substrate of claim 1 wherein a mass ratio of the self-assembly solder to the base solder is between 0.5 and 1.

8. The electrical component substrate of claim 1 wherein the self-assembly solder is gallium or an alloy of gallium.

9. The electrical component substrate of claim 1 wherein the self-assembly solder and the base solder contain a same low melting point element selected from Bi, In and Sn.

10. The electrical component substrate of claim 1 wherein the self-assembly solder and the base solder contain Bi, and a mass fraction, RM, of the self-assembly solder to the base solder is determined by a formula $$R_M = \frac{x_{Bi-SA}}{x_{Bi-Comp}} - 1$$

wherein $x_{Bi-SA}$ is a mass concentration of Bi in the self-assembly solder and $x_{Bi-Comp}$ is a mass concentration of Bi in a composite solder formed by combining the self-assembly solder and the base solder.

11. The electrical component substrate of claim 1 wherein a molar fraction of the self-assembly solder in the dual solder layer is at least 10%.

12. The electrical component substrate of claim 1 wherein a molar fraction of the self-assembly solder in the dual solder layer is at least 50%.

13. The electrical component substrate of claim 1 wherein a melting point of the base solder is above an operating temperature of an electrical component to be mounted to the electrical substrate and below a temperature at which the electrical component or substrate is damaged.

14. The electrical component substrate of claim 1 wherein the self-assembly solder contains at least one of a low melting point element selected from Ga, In, Bi, Se, Sn and Zn.

* * * * *